United States Patent
Lin et al.

(10) Patent No.: US 10,148,239 B1
(45) Date of Patent: Dec. 4, 2018

(54) CIRCUIT WITH CO-MATCHING TOPOLOGY FOR TRANSMITTING AND RECEIVING RF SIGNALS

(71) Applicant: Rafael Microelectronics, Inc., Hsinchu County (TW)

(72) Inventors: Ying Yao Lin, Hsinchu County (TW); Tao Chiang, Hsinchu (TW)

(73) Assignee: RAFAEL MICROELECTRONICS, INC., Hsinchu (TW)

( * ) Notice: Subject to any disclaimer, the term of this patent is extended or adjusted under 35 U.S.C. 154(b) by 0 days.

(21) Appl. No.: 15/810,147

(22) Filed: Nov. 13, 2017

(51) Int. Cl.
  *H03F 3/72* (2006.01)
  *H03F 1/56* (2006.01)
  *H03F 3/195* (2006.01)
  *H03F 3/213* (2006.01)

(52) U.S. Cl.
  CPC .............. *H03F 3/72* (2013.01); *H03F 1/565* (2013.01); *H03F 3/195* (2013.01); *H03F 3/213* (2013.01); *H03F 2200/165* (2013.01); *H03F 2200/171* (2013.01); *H03F 2200/222* (2013.01); *H03F 2200/225* (2013.01); *H03F 2200/231* (2013.01); *H03F 2200/294* (2013.01); *H03F 2200/451* (2013.01)

(58) Field of Classification Search
  CPC ......... H03F 2200/387; H03F 2200/318; H03F 2200/171; H03F 1/56; H03F 2200/391; H03F 1/565; H03F 3/72; H03F 3/195; H03F 3/213
  See application file for complete search history.

(56) References Cited

U.S. PATENT DOCUMENTS

| | | | |
|---|---|---|---|
| 2005/0206457 A1* | 9/2005 | Martin | H03F 1/0211 330/305 |
| 2007/0262829 A1* | 11/2007 | Chominski | H01P 1/127 333/103 |
| 2010/0321129 A1* | 12/2010 | Onody | H01P 1/213 333/124 |
| 2014/0295774 A1* | 10/2014 | Wu | H04B 1/401 455/73 |
| 2017/0146591 A1* | 5/2017 | Nobbe | G01R 31/28 |

* cited by examiner

*Primary Examiner* — Devan A Sandiford
(74) *Attorney, Agent, or Firm* — Min-Lee Teng; Litron Patent & Trademark Office

(57) ABSTRACT

A circuit with co-matching topology for transmitting and receiving RF signals, said circuit comprising: a first sub-circuit comprising a first inductive component and a first capacitive component to form a low-pass filter for transmitting a first RF signal from a first amplifier to an antenna, wherein the first inductive component is coupled to a ground via a first switch; and a second sub-circuit comprising a second inductive component and a second capacitive component for receiving a second RF signal from the antenna to an input terminal of a second amplifier, wherein said input terminal of the second amplifier is coupled to the ground via a second switch; wherein when the first amplifier is transmitting the first RF signal, the first switch is turned off and the second switch is turned on, and wherein when the second amplifier is receiving the second RF signal, the first switch is turned on and the second switch is turned off.

19 Claims, 5 Drawing Sheets

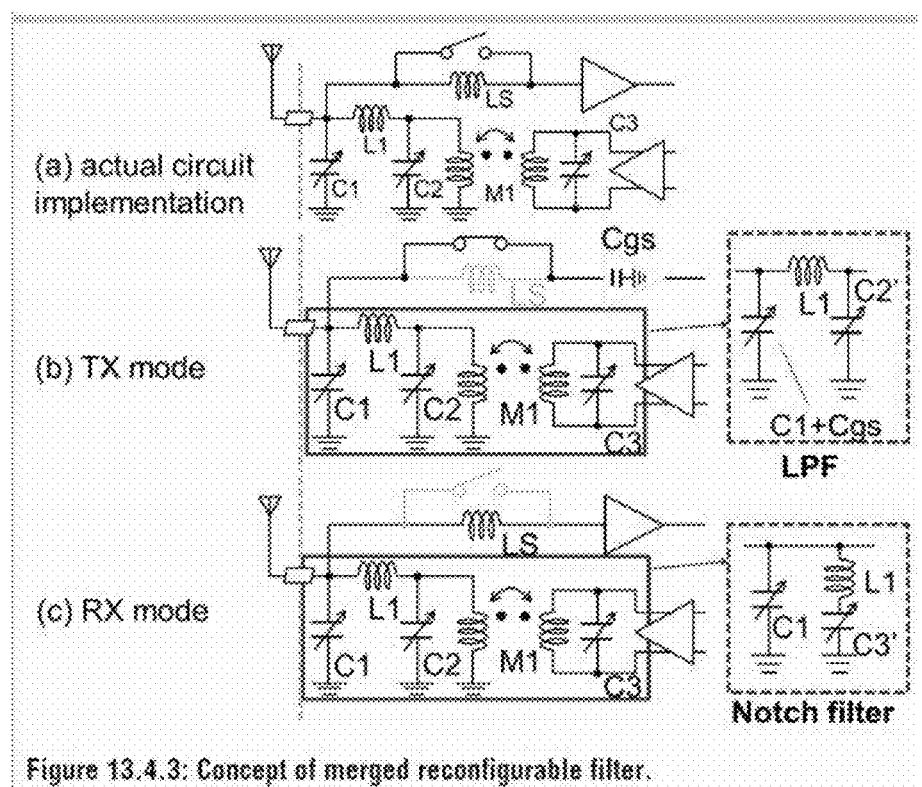
FIG. 2 (PRIOT ART)

CIRCUIT WITH CO-MATCHING TOPOLOGY FOR TRANSMITTING AND RECEIVING RF SIGNALS

BACKGROUND OF THE INVENTION

1. Field of the Invention

The invention relates to a circuit for transmitting and receiving RF signals and, in particular, but not exclusively, to a circuit with co-matching topology for transmitting and receiving RF signals.

2. Description of the Prior Art

FIG. 1 shows a conventional circuit for transmitting and receiving RF signals, wherein there is a physical switch to select a transmitting mode for transmitting an RF signal or a receiving mode for receiving an RF signal, and there is a dedicated matching circuit for each of the transmitting mode and the receiving mode. By doing so, the physical switch and the matching circuits are adding complexity for board design and the matching circuits are not fully used in either of the transmitting mode and the receiving mode.

FIG. 2 shows a conventional circuit for transmitting and receiving RF signals, wherein there is an embedded switch to select a transmitting mode for transmitting an RF signal or a receiving mode for receiving an RF signal, and the matching circuit for the receiving mode is not fully used in transmitting mode.

Accordingly, there is a need to provide a better solution to resolve aforementioned issues while increasing the performance of the circuit for transmitting and receiving RF signals.

SUMMARY OF THE INVENTION

One objective of present invention is to provide a circuit with co-matching topology for transmitting and receiving RF signals, so that the matching circuit in transmitting mode can be used in receiving mode and the matching circuit in receiving mode can be used in transmitting mode to increase the performance of the circuit.

One objective of present invention is to provide a circuit with co-matching topology for transmitting and receiving RF signals, so that the matching circuit in transmitting mode can be configured as a band-pass filter in receiving mode to enhance the signal quality of the received RF signal.

One objective of present invention is to provide a circuit with co-matching topology for transmitting and receiving RF signals, so that the matching circuit in receiving mode can be configured as a notch filter in transmitting mode to reject a pre-defined frequency in the transmitted RF signal.

The present invention discloses a circuit with co-matching topology for transmitting and receiving RF signals, said circuit comprising: a first sub-circuit, comprising a first inductive component, a first capacitive component and a first switch, wherein a first terminal of the first inductive component is coupled to an antenna and a second terminal of the inductive component is coupled to an output terminal of a first amplifier for transmitting a first RF signal, wherein the first terminal of the first inductive component is coupled to a ground via the first capacitive component and the second terminal of the first inductive component is coupled to the ground via the first switch; and a second sub-circuit, comprising a second inductive component, a second capacitive component and a second switch, wherein the second inductive component and the second capacitive component are connected in series and said antenna is coupled to an input terminal of a second amplifier via the second inductive component and the second capacitive component for receiving a second RF signal, and wherein said input terminal of the second amplifier is coupled to the ground via the second switch; wherein when the first amplifier is transmitting the first RF signal, the first switch is turned off and the second switch is turned on, and wherein when the second amplifier is receiving the second RF signal, the first switch is turned on and the second switch is turned off.

In one embodiment, the first inductive component and the first capacitive component operate at a first resonant frequency, and the second inductive component and the second capacitive component operate at said first resonant frequency.

In one embodiment, the second sub-circuit further comprises a third inductive component and a third switch, wherein the third inductive component and the third switch are connected in series to form a serial component that is connected in parallel with the second inductive component, wherein the third switch is turned off when the second amplifier is receiving the second RF signal, and the third switch is turned on when the first amplifier is transmitting the first RF signal.

In one embodiment, when the first amplifier is transmitting the first RF signal, the second sub-circuit forms a notch filter operating at a pre-defined resonant frequency.

In one embodiment, the pre-defined frequency is a second order harmonic frequency of the first RF signal.

In one embodiment, the pre-defined frequency is a third order harmonic frequency of the first RF signal.

In one embodiment, when the first amplifier is receiving the second RF signal, the first sub-circuit forms band-pass filter operating at the first resonant frequency.

In one embodiment, the first sub-circuit and the second sub-circuit are integrated in a single chip.

The present invention discloses a circuit with co-matching topology for transmitting and receiving RF signals, said circuit comprising: a first sub-circuit, comprising a first filter network, wherein a first terminal of the first filter network is coupled to an antenna and a second terminal of the first filter network is coupled to an output terminal of a first amplifier for transmitting a first RF signal to the antenna via the first filter network; and a second sub-circuit, comprising a first inductive component, a first capacitive component, a first switch, a second inductive component and a second switch, wherein the first inductive component and the first capacitive component are connected in series and said antenna is coupled to an input terminal of a second amplifier via the first inductive component and the first capacitive component for receiving a second RF signal, and wherein said input terminal of the second amplifier is coupled to a ground via the first switch, wherein the second inductive component and the second switch are connected in series to form a serial component 340 that is connected in parallel with the first inductive component; wherein when the first amplifier is transmitting the first RF signal, each of the first switch and the second switch is turned on so that the second sub-circuit forms a notch filter operating at a pre-defined resonant frequency.

In one embodiment, the first filter network comprises a low-pass filter, and the first amplifier transmits the first RF signal to the antenna through the low-pass filter.

In one embodiment, the first filter network comprises a notch filter.

The detailed technology and above preferred embodiments implemented for the present invention are described in the following paragraphs accompanying the appended drawings for people skilled in the art to well appreciate the features of the claimed invention.

BRIEF DESCRIPTION OF DRAWINGS

The foregoing aspects and many of the accompanying advantages of this invention will become more readily appreciated as the same becomes better understood by reference to the following detailed description when taken in conjunction with the accompanying drawings, wherein:

FIG. 2 illustrates a conventional circuit with a co-matching topology for transmitting and receiving RF signals;

DETAILED DESCRIPTION OF EMBODIMENT

The detailed explanation of the present invention is described as follows. The described preferred embodiments are presented for purposes of illustrations and description, and they are not intended to limit the scope of the present invention.

Figure 1:
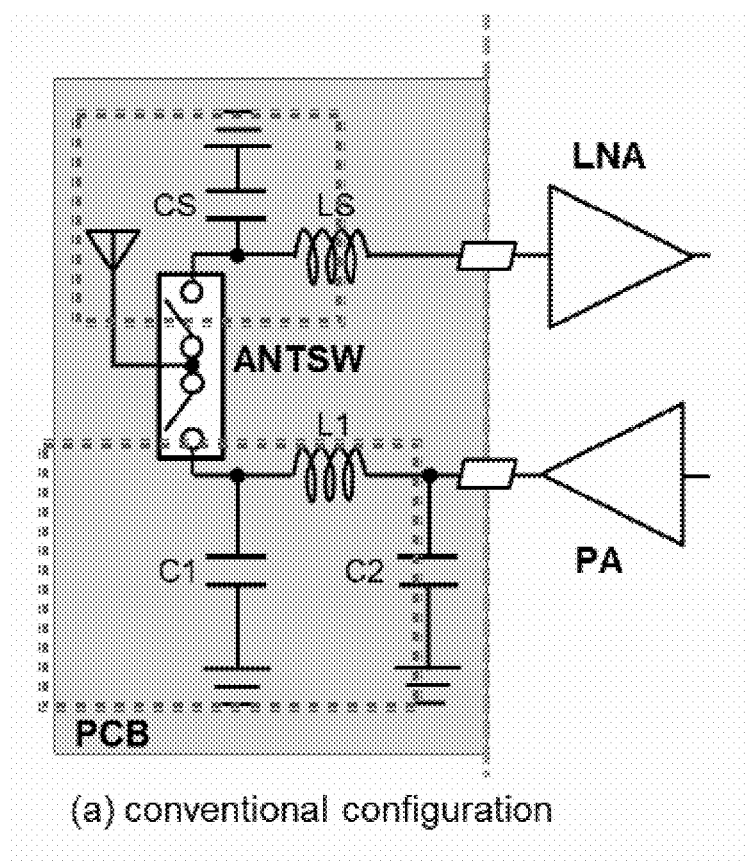
FIG. 1 illustrates a conventional circuit without having a co-matching topology for transmitting and receiving RF signals.
Figure 3A:
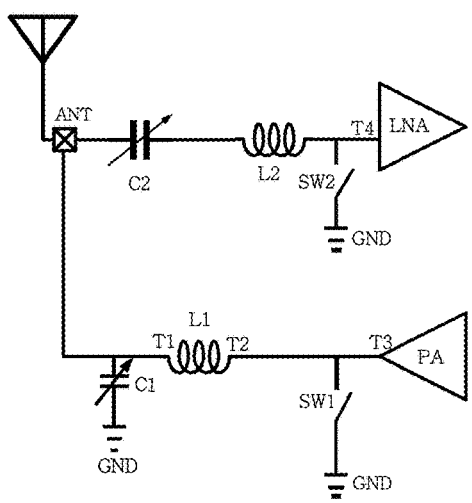
FIG. 3A illustrates a circuit with a co-matching topology for transmitting and receiving RF signals according to one embodiment of the present invention.

FIG. 3A illustrates a circuit with a co-matching topology for transmitting and receiving RF signals according to one embodiment of the present invention. As shown in FIG. 3A, the circuit with a co-matching topology for transmitting and receiving RF signals comprises a first sub-circuit, comprising a first inductive component L1, a first capacitive component C1 and a first switch SW1, wherein a first terminal T1 of the first inductive component L1 is coupled to an antenna ANT and a second terminal T2 of the first inductive component L1 is coupled to an output terminal T3 of a first amplifier such a power amplifier PA for transmitting a first RF signal, wherein the first terminal T1 of the first inductive component L1 is coupled to a ground GND via the first capacitive component C1 and the second terminal T2 of the first inductive component L1 is coupled to the ground GND via the first switch SW1; and a second sub-circuit, comprising a second inductive component L2, a second capacitive component C2 and a second switch SW2, wherein the second inductive component L2 and the second capacitive component C2 are connected in series and the antenna ANT is coupled to an input terminal T4 of a second amplifier such as a low-noise amplifier LNA via the second inductive component L2 and the second capacitive component C2 for receiving a second RF signal, and wherein said input terminal T4 of the second amplifier such as a low-noise amplifier LNA is coupled to the ground GND via the second switch SW2; wherein when the first amplifier PA is transmitting the first RF signal, the first switch SW1 is turned off and the second switch SW2 is turned on, and wherein when the second amplifier LNA is receiving the second RF signal, the first switch SW1 is turned on and the second switch SW2 is turned off.

Figure 3B:
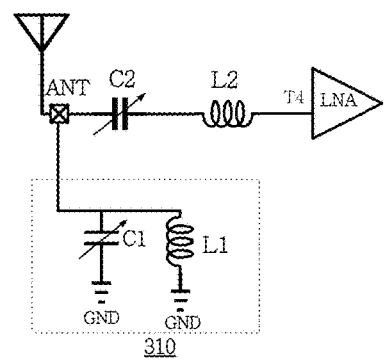
FIG. 3B illustrates the receiving mode of the circuit of FIG. 3A.

FIG. 3B illustrates the receiving mode of the circuit of FIG. 3A. As shown in FIG. 3B, when the circuit is receiving the second RF signal, the first switch SW1 is turned on to couple the second terminal T2 of the first inductive component L1 to the ground GND via the first switch SW1. As a result, the first sub-circuit comprising the first inductive component L1 and the first capacitive component C1 and the first switch SW1 form a band-pass filter 310 for receiving the second RF signal, wherein the second switch SW2 is turned off so that the second RF signal will be conducted from the antenna ANT to the input terminal T4 of the second amplifier LNA via the second inductive component L2 and the second capacitive component C2.

Figure 3C:
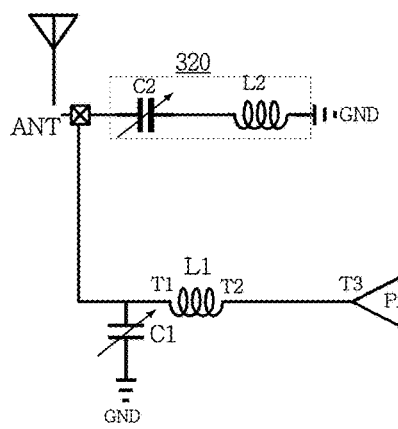
FIG. 3C illustrates the transmitting mode of the circuit of FIG. 3A.

FIG. 3C illustrates the transmitting mode of the circuit of FIG. 3A. As shown in FIG. 3C, when the circuit is transmitting the first RF signal, the first switch SW1 is turned off and the second switch SW2 is turned on. As a result, the second sub-circuit comprising the second inductive component L2, the second capacitive component C2 and the second switch SW2 form a notch filter 320 for transmitting the first RF signal, wherein the output terminal T3 of the first amplifier PA transmits the first RF signal to the antenna ANT via a low-pass filter formed by the first inductive component L1 and the first capacitive component C1. Please note that there is no switch in the conductive path from the antenna ANT to the input terminal T4 of the second amplifier LNA and there is no switch in the conductive path from the output terminal T3 of the first amplifier PA. Therefore the circuit of FIG. 3A has a co-matching topology for transmitting and receiving RF signals. The switch SW1 and the switch SW2 can be embedded in a chip, and each of the switch SW1 and the switch SW2 can be made of a transistor with a control signal to turn the switch on or off. Please note that each of the inductive component L1, L2 can be made of a single inductor or in combination of inductors such that the resulting inductance can be derived based on the inductors that are connected in a certain way. Please note that each of the capacitive component CL C2 can be made of a single capacitor or in combination of capacitor s such that the resulting capacitance can be derived based on the capacitors that are connected in a certain way.

In one embodiment, the first inductive component and the first capacitive component operate at a first resonant frequency, and the second inductive component and the second capacitive component operate at said first resonant frequency. In one embodiment, said first resonant frequency is 2.4 G Hz.

In one embodiment, the first capacitive component C1 is a first variable capacitor so that the capacitance of the first variable capacitor can be adjusted to meet a specific frequency requirement after the circuit is fabricated. For example, the first variable capacitor can be adjusted to compensate the extra capacitance introduced by the first switch SW1 so that the first sub-circuit comprising the first inductive component L1 and the first capacitive component C1 and the first switch SW1 form a band-pass filter 310 with a resonant frequency operating at 2.4 G Hz for receiving the second RF signal. By doing so, the signal loss of the second RF signal can be reduced significantly.

In one embodiment, the second capacitive component C2 is a second variable capacitor so that so that the capacitance of the second variable capacitor can be adjusted to meet a specific frequency requirement after the circuit is fabricated. For example, the second variable capacitor can be adjusted so that the second sub-circuit comprising the second inductive component L2, the second capacitive component C2 and the second switch SW2 form a band-stop or a notch filter 320 with a resonant frequency operating at a frequency different from 2.4 G Hz for transmitting the first RF signal.

Figures 4A, 4B, 4C:
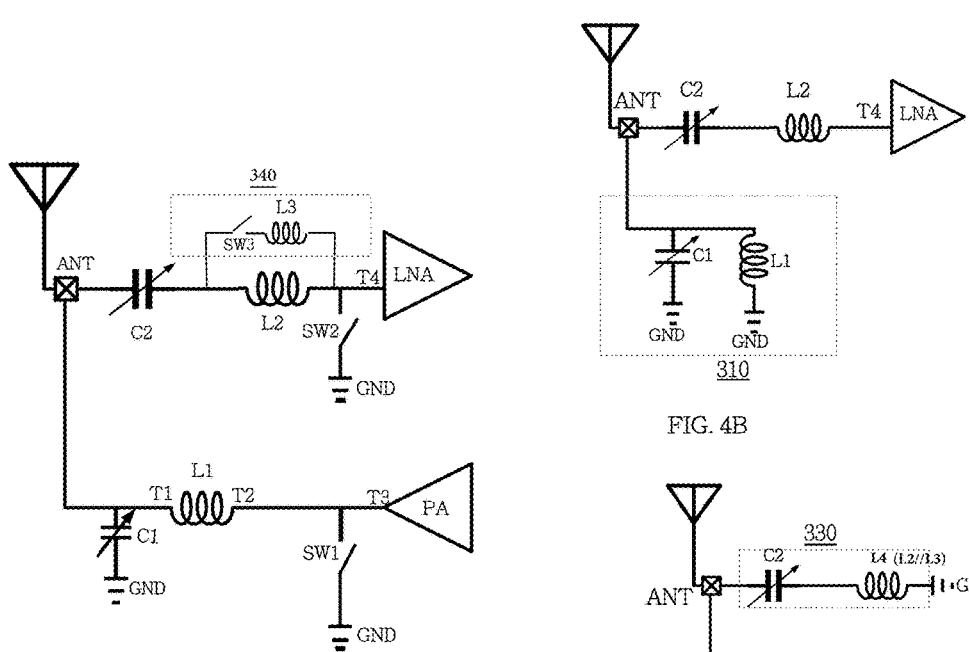
FIG. 4A illustrates a circuit with a co-matching topology for transmitting and receiving RF signals according to one embodiment of the present invention.
FIG. 4B illustrates the receiving mode of the circuit of FIG. 4A.
FIG. 4C illustrates the transmitting mode of the circuit of FIG. 4A.

In one embodiment, as shown in FIG. 4A, the second sub-circuit further comprises a third inductive component L3 and a third switch SW3, wherein the third inductive component L3 and the third switch SW3 are connected in series to form a serial component 340 that is connected in parallel with the second inductive component L2, wherein the third switch L3 is turned off when the second amplifier LNA is receiving the second RF signal, and the third switch L3 is turned on when the first amplifier PA is transmitting the first RF signal. Please note that the third inductive component L3 and the third switch SW3 of the serial component 340 can be arranged with the third inductive component L3 located in front of the third switch SW3 (not shown) or with the third switch SW3 located in front of the third inductive component L3 as shown in FIG. 4A.

FIG. 4B illustrates the receiving mode of the circuit of FIG. 4A. As shown in FIG. 4B, when the circuit is receiving the second RF signal, the first switch SW1 is turned on to couple the second terminal T2 of the first inductive component L1 to the ground GND via the first switch SW1. As a result, the first sub-circuit comprising the first inductive component L1 and the first capacitive component C1 and the first switch SW1 form a band-pass filter 310 for receiving the second RF signal, wherein the second switch SW2 is turned off so that the second RF signal will be conducted from the antenna ANT to the input terminal T4 of the second amplifier LNA via the second inductive component L2 and the second capacitive component C2.

FIG. 4C illustrates the transmitting mode of the circuit of FIG. 4A. As shown in FIG. 4C, when the circuit is transmitting the first RF signal, the first switch SW1 is turned off and the second switch SW2 is turned on. As a result, the second sub-circuit comprising the second inductive component L2, the third inductive component L3, the third switch SW3, the second capacitive component C2 and the second switch SW2 form a notch filter 330 for transmitting the first RF signal, wherein the third inductive component L3, the third switch SW3 forms a serial component 340 that is connected in parallel with the second inductive component L2, and the inductive component L4 has an inductance that is equivalent to the resulting inductance of the second inductive component L2 and the inductive component L3 that is connected in parallel with the second inductive component L2. By doing so, the resonant frequency of the notch filter 330 can be operating at a pre-defined resonant frequency that is higher than the frequency of the first and second RF signals. For example, the pre-defined frequency is the frequency of the second order harmonic of the first RF signal, or the pre-defined frequency is the frequency of the third order harmonic of the first RF signal. That is, if the frequency of the first and second RF signals are operating at 2.4 G Hz, the notch filter 330 can be operating at the second order harmonic of the first RF signal, which is 4.8 G Hz, or the notch filter 330 can be operating at the third order harmonic of the first RF signal, which is 7.2 G Hz, depending upon the resulting inductance of the inductive component L4.

Figure 5A:
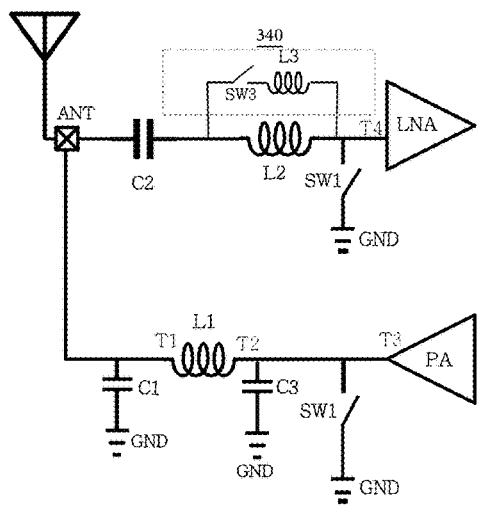
FIG. 5A illustrates a circuit with a co-matching topology for transmitting and receiving RF signals according to one embodiment of the present invention.
Figure 5B:
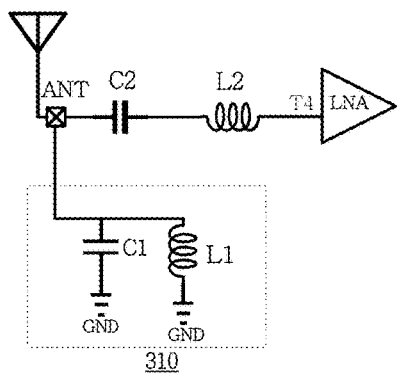
FIG. 5B illustrates the receiving mode of the circuit of FIG. 5A.
Figure 5C:
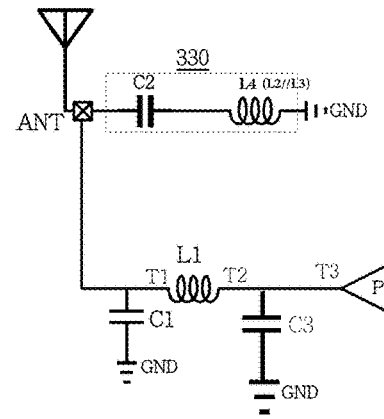
FIG. 5C illustrates the transmitting mode of the circuit of FIG. 5A.

In one embodiment, as shown in FIG. 5A, the first sub-circuit further comprises a third capacitive component C3, and the second terminal T2 of the first inductive component L1 is coupled to the ground GND via the third capacitive component C3. By doing so, when the circuit is in the transmitting mode, as shown in FIG. 5C, the first sub-circuit forms a filter network by the first inductive component L1, the first capacitive component C1, and the third capacitive component C3, and when the circuit is in the receiving mode, the third capacitive component C3 will be bypassed by turning on the first switch SW1, which means the third capacitive component C3 will have no effect when the circuit is in the receiving mode, as shown in FIG. 5B. In one embodiment, the third capacitive component C3 can be connected in series with a fourth inductive component to form a notch filter for transmitting the first RF signal. That is, the filter network can be configured in many ways for transmitting the first RF signal. For example, the filter network between the antenna ANT and the first amplifier PA can be a low-pass filter or a notch filter or the filter network can include both a low-pass filter and a notch filter or other suitable filter, depending on the design requirement.

Please note that each of the inductive component L1, L2, L3 can be made of a single inductor or in combination of inductors such that the resulting inductance can be derived based on the inductors that are connected in a certain way. Please note that each of the capacitive component C1, C2, C3 can be made of a single capacitor or in combination of capacitors such that the resulting capacitance can be derived based on the capacitors that are connected in a certain way.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application to thereby enable others skilled in the art to best utilize the invention and various embodiments with various modifications as are suited to the particular use contemplated. It is intended that the scope of the invention be defined by the claims appended hereto and their equivalents.

What is claimed is:

1. A circuit with co-matching topology for transmitting and receiving RF signals, said circuit comprising:
    a first sub-circuit, comprising a first inductive component, a first capacitive component and a first switch, wherein a first terminal of the first inductive component is coupled to an antenna and a second terminal of the first inductive component is coupled to an output terminal of a first amplifier for transmitting a first RF signal to the antenna, wherein the first terminal of the first inductive component is coupled to a ground via the first capacitive component and the second terminal of the first inductive component is coupled to the ground via the first switch; and
    a second sub-circuit, comprising a second inductive component, a second capacitive component and a second switch, wherein the second inductive component and the second capacitive component are connected in series, and the antenna is coupled to an input terminal of a second amplifier via the second inductive component and the second capacitive component for receiving a second RF signal from the antenna, and wherein said input terminal of the second amplifier is coupled to the ground via the second switch;

wherein when the first amplifier is transmitting the first RF signal, the first switch is turned off and the second switch is turned on, and wherein when the second amplifier is receiving the second RF signal, the first switch is turned on and the second switch is turned off, wherein the first inductive component, the first capacitive component, the second inductive component, and the second capacitive component are all operating when the first amplifier is transmitting the first RF signal; and wherein the first inductive component, the first capacitive component, the second inductive component, and the second capacitive component are all operating when the second amplifier is receiving the second RF signal.

2. The circuit of claim 1, wherein the first inductive component and the first capacitive component operate at a first resonant frequency, and the second inductive component and the second capacitive component operate at said first resonant frequency, wherein said first resonant frequency is 2.4 G Hz.

3. The circuit of claim 1, wherein the second capacitive component is a variable capacitor.

4. The circuit of claim 1, wherein when the first amplifier is transmitting the first RF signal, the second sub-circuit forms a notch filter operating at a pre-defined resonant frequency.

5. The circuit of claim 4, wherein the pre-defined resonant frequency is the frequency of the second order harmonic of the first RF signal.

6. The circuit of claim 4, wherein the pre-defined resonant frequency is the frequency of the third order harmonic of the first RF signal.

7. The circuit of claim 5, wherein the frequency of the second order harmonic is 4.8 G Hz.

8. The circuit of claim 6, wherein the frequency of the third order harmonic is 7.2 G Hz.

9. The circuit of claim 1, wherein the first sub-circuit further comprises a third capacitive component, and the second terminal of the inductive component is coupled to the ground via the third capacitive component.

10. The circuit of claim 1, wherein the first capacitive component is a variable capacitor.

11. The circuit of claim 1, wherein the first sub-circuit and the second sub-circuit are integrated in a single chip.

12. A circuit with co-matching topology for transmitting and receiving RF signals, said circuit comprising:
a first sub-circuit, comprising a first filter network and a first switch, wherein a first terminal of the first filter network is coupled to an antenna and a second terminal of the first filter network is coupled to an output terminal of a first amplifier for transmitting a first RF signal to the antenna, wherein the output terminal of the first amplifier is coupled to a ground via the first switch; and
a second sub-circuit, comprising a first inductive component, a first capacitive component, a second switch, a second inductive component and a third switch, wherein the first inductive component and the first capacitive component are connected in series, and the antenna is coupled to an input terminal of a second amplifier via the first inductive component and the first capacitive component for receiving a second RF signal from the antenna, and wherein said input terminal of the second amplifier is coupled to the ground via the second switch, wherein the second inductive component and the third switch are connected in series to form a serial component that is connected in parallel with the first inductive component;

wherein when the second amplifier is receiving the second RF signal, the first switch is turned on, and each of the second switch and the third switch is turned off, and wherein when the first amplifier is transmitting the first RF signal, the first switch is turn off, and each of the second switch and the third switch is turned on to configure the second sub-circuit as a notch filter operating at a pre-defined resonant frequency.

13. The circuit of claim 12, wherein the first inductive component and the first capacitive component operate at a resonant frequency of 2.4 G Hz.

14. The circuit of claim 12, wherein the pre-defined resonant frequency is the frequency of the second order harmonic of the first RF signal.

15. The circuit of claim 12, wherein the pre-defined resonant frequency is the frequency of the third order harmonic of the first RF signal.

16. The circuit of claim 15, wherein the frequency of the third order harmonic of the first RF signal is 7.2 G Hz.

17. The circuit of claim 12, wherein the first filter network comprises a low-pass filter, and the first amplifier transmits the first RF signal to the antenna through the low-pass filter.

18. The circuit of claim 12, wherein the first filter network comprises a notch filter.

19. A circuit with co-matching topology for transmitting and receiving RF signals, said circuit comprising:
a first sub-circuit, comprising a first inductive component, a first capacitive component and a first switch, wherein a first terminal of the first inductive component is coupled to an antenna and a second terminal of the first inductive component is coupled to an output terminal of a first amplifier for transmitting a first RF signal to the antenna, wherein the first terminal of the first inductive component is coupled to a ground via the first capacitive component and the second terminal of the first inductive component is coupled to the ground via the first switch; and
a second sub-circuit, comprising a second inductive component, a second capacitive component and a second switch, wherein the second inductive component and the second capacitive component are connected in series, and the antenna is coupled to an input terminal of a second amplifier via the second inductive component and the second capacitive component for receiving a second RF signal from the antenna, and wherein said input terminal of the second amplifier is coupled to the ground via the second switch;

wherein when the first amplifier is transmitting the first RF signal, the first switch is turned off and the second switch is turned on, and wherein when the second amplifier is receiving the second RF signal, the first switch is turned on and the second switch is turned off, wherein the second sub-circuit further comprises a third inductive component and a third switch, wherein the third inductive component and the third switch are connected in series to form a serial component that is connected in parallel with the second inductive component, wherein the third switch is turned off when the second amplifier is receiving the second RF signal, and the third switch is turned on when the first amplifier is transmitting the first RF signal.

* * * * *